(12) United States Patent
Dubin

(10) Patent No.: US 6,677,233 B2
(45) Date of Patent: Jan. 13, 2004

(54) MATERIAL DEPOSITION FROM A LIQUEFIED GAS SOLUTION

(75) Inventor: Valery M. Dubin, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 10/039,095

(22) Filed: Jan. 2, 2002

(65) Prior Publication Data

US 2003/0124840 A1 Jul. 3, 2003

(51) Int. Cl.[7] ............................................... H01L 21/44
(52) U.S. Cl. ..................... 438/658; 438/622; 438/643; 438/687; 438/677; 438/678; 438/680; 438/684; 438/745
(58) Field of Search ................................ 438/684, 622, 438/643, 658, 687, 677, 678, 686, 745

(56) References Cited

U.S. PATENT DOCUMENTS

| | | | |
|---|---|---|---|
| 4,517,253 A | | 5/1985 | Rose et al. |
| 4,804,410 A | * | 2/1989 | Haga et al. .................. 427/304 |
| 4,927,786 A | | 5/1990 | Nishida |
| 5,229,334 A | * | 7/1993 | Kato ........................... 438/694 |
| 5,308,400 A | * | 5/1994 | Chen ............................. 134/2 |
| 5,811,334 A | * | 9/1998 | Buller et al. ................. 438/264 |
| 6,063,707 A | | 5/2000 | Atwater et al. |
| 6,100,200 A | | 8/2000 | Van Buskirk et al. |
| 6,129,091 A | * | 10/2000 | Lee et al. ....................... 134/3 |
| 6,180,524 B1 | | 1/2001 | Ferrell |
| 6,207,522 B1 | | 3/2001 | Hunt et al. |
| 6,423,200 B1 | * | 7/2002 | Hymes ........................ 205/123 |

OTHER PUBLICATIONS

Wolf and Tauber, "Silicon Processing for the VLSI era", vol. 1 Process Technology, pp. 516–517.*
Wolf and Tauber, "Silicon Processing for the VLSI era", vol. 2 Process Technology, pp. 256–257, 260.*
Search Report for PCT/US 02/41705, mailed Jun. 11, 2003, 4 pages.

* cited by examiner

Primary Examiner—Kamand Cuneo
Assistant Examiner—Lisa Kilday
(74) Attorney, Agent, or Firm—Blakely, Sokoloff, Taylor & Zafman LLP

(57) ABSTRACT

Introduction of a liquefied gas solution for deposition of a material on a semiconductor substrate. The substrate can have a trench etched thereinto with the solution including ions of the material to be deposited in the trench. The substrate can have a barrier layer at its surface prior to introduction of a liquefied gas solution including ions of a metal to be deposited above the barrier. A material layer to be formed on the substrate can be a tantalum barrier, a copper layer or other semiconductor processing feature.

22 Claims, 4 Drawing Sheets

MATERIAL DEPOSITION FROM A LIQUEFIED GAS SOLUTION

BACKGROUND

The present invention relates to semiconductor fabrication. In particular, the present invention relates to semiconductor processing feature deposition methods.

BACKGROUND OF THE RELATED ART

In the fabrication of semiconductor devices, materials of varying purposes are deposited on a semiconductor substrate. For example, a metal layer can be deposited on a patterned substrate to form capacitor features such as parallel metal lines. The patterned substrate will include trenches to accommodate the metal lines.

A barrier layer is often first formed on the patterned substrate and within the trenches to prevent diffusion of metal ions into the substrate. For example, where copper (Cu) metal lines are to be formed in the trenches, a barrier layer of tantalum (Ta) can first be deposited to prevent copper ions (e.g. $Cu^+$) from diffusing beyond the trenches into the substrate and compromising performance of the semiconductor device. The copper (Cu) can then be deposited above the tantalum (Ta) barrier. Deposition may proceed by, for example, a physical vapor depositon (PVD) process, a chemical vapor deposition (CVD) process or a plasma enhanced CVD (e.g. PECVD) process.

Where a barrier layer is deposited as described above, oxidation occurs on the surface of the barrier layer as it is exposed to air. This generally occurs as the substrate is transferred from a barrier deposition reactor to another reactor for deposition of the metal layer. Unfortunately, the metal to be deposited does not adhere as well to the barrier layer once it has been oxidized. Therefore, to ensure better adherence between the metal and barrier layers, added measures are often taken prior to complete metal layer deposition. For example, a seed layer of the metal to be deposited is generally deposited above the barrier layer including within the narrow trenches. The thin seed layer is fairly uniform and continuous. The seed layer can be deposited by a physical vapor deposition (PVD) process. The formation of an initial seed layer prior to complete metal layer deposition increases, to a limited extent, the adherence between the barrier layer and the fully deposited metal layer. However, adding a seed layer requires additional time and expense, decreasing the overall efficiency of semiconductor processing.

In addition to decreased efficiency, the degree of uniformity in thickness of the seed layer described above is limited. Unfortunately, in a trench to be filled completely by a metal, a non-uniform seed layer can lead to occlusion of the trench. For example, where thicker portions of the seed layer from opposing walls of the trench come in contact with one another (or close to one another), the trench can be precluded from adequate metal deposition there below leaving trapped voids. Thicker seed layer portions are near the top, step portion, of the trench. These thicker portions of the seed layer are generally referred to as "overhang". As trenches become smaller and smaller, with trench walls coming closer and closer together, the problem of overhang becomes even more pronounced.

It is possible for surface oxides to be dissolved and use of a seed layer avoided for purposes of adhesion. However, deposition of the entire metal layer directly on the barrier layer by conventional methods, such as CVD or PECVD, does not naturally occur in a 'bottom up' (super-fill) manner. That is, conventional deposition methods fail to ensure that the metal layer is formed from the bottom of the trench up. Therefore, the likelihood of trapped voids and inadequate metal layer formation remains.

DETAILED DESCRIPTION

Descriptions of methods of material deposition from a liquefied gas solution in the formation of semiconductor features follow. Aspects of embodiments are described and illustrated by the accompanying drawings. While embodiments are described with reference to deposition of certain materials by certain liquefied gasses, the embodiments are applicable to the deposition of any semiconductor material on a substrate with appropriate liquefied gas. Embodiments can be particularly useful when metal lines are to be formed within trenches of a patterned substrate, where the trenches include a barrier layer prior to formation of the metal lines.

Embodiments described below are generally applicable to semiconductor processing of a patterned substrate. Once trenches have been patterned into the substrate, a liquefied gas solution that includes ions of a particular material is introduced to the substrate and the material is deposited on the substrate by electroplating or electroless deposition. In one embodiment, the trench is lined with a barrier layer and the material deposited above the barrier layer.

Figure 1:
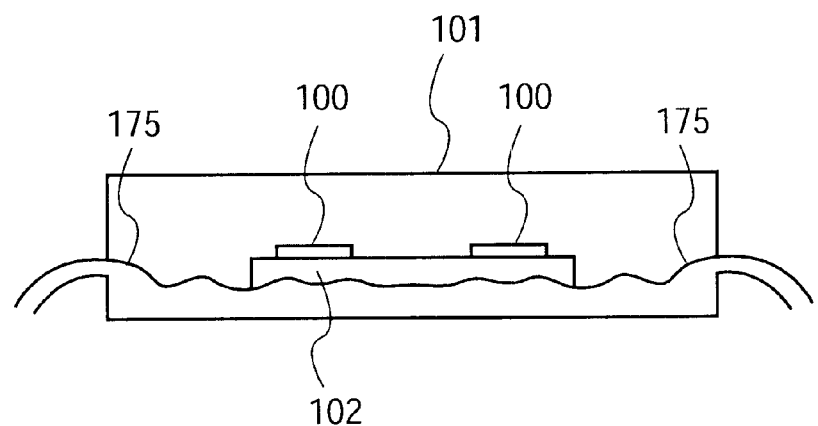
FIG. 1 is a side cross-sectional view of a reactor revealing semiconductor substrates therein to undergo material deposition from a liquefied gas solution.

Referring now to FIG. 1 an embodiment of a reaction chamber 101 is shown that includes a susceptor 102 therein to support semiconductor substrates 100 during application of liquid deposition. As described further herein, methods of material deposition from a liquefied gas solution include the introduction of a liquefied gas solution, such as a barrier forming liquefied gas solutions 175, into the reaction chamber 101. During deposition, a substrate 100 is submerged in liquefied gas solution containing materials to be deposited on a surface of the substrate 100. As described further herein various liquefied gas solutions can be employed for deposition purposes. As mentioned here, a liquefied gas solution is intended to refer to a liquid solution that includes a solvent that is of a gas form but due to factors, such as altered temperature or pressure, is provided in a liquid state by methods described further herein.

Figure 2:
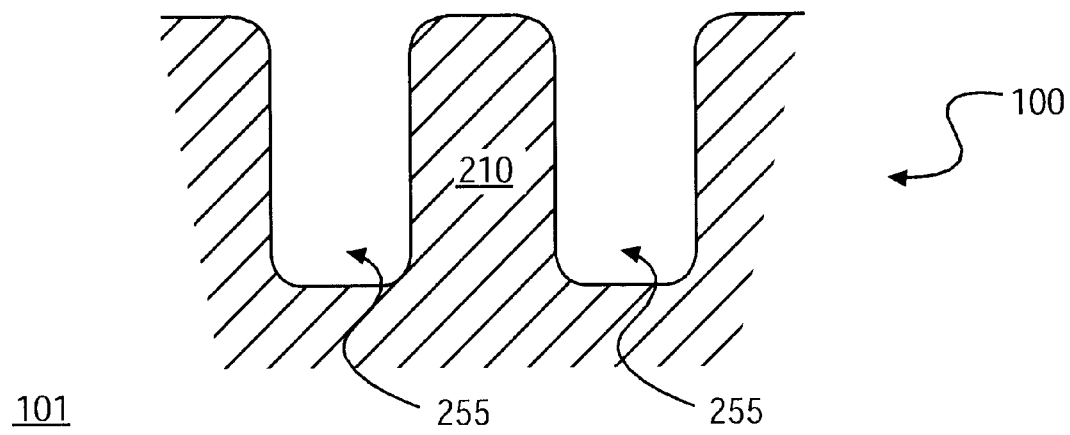
FIG. 2 is a side cross-sectional view of a semiconductor substrate of FIG. 1 to undergo a method of barrier layer deposition.

Referring to FIG. 2 an embodiment of a substrate 100 is shown that is exposed to a barrier forming liquefied gas solutions 175 to deposit barrier material in trenches 255 of the substrate 100. Deposition occurs as a current is run through an anode 290 to electroplate barrier material from the barrier forming liquefied gas solutions 175 to a surface of the substrate 100 within the trenches 255.

Figure 6:
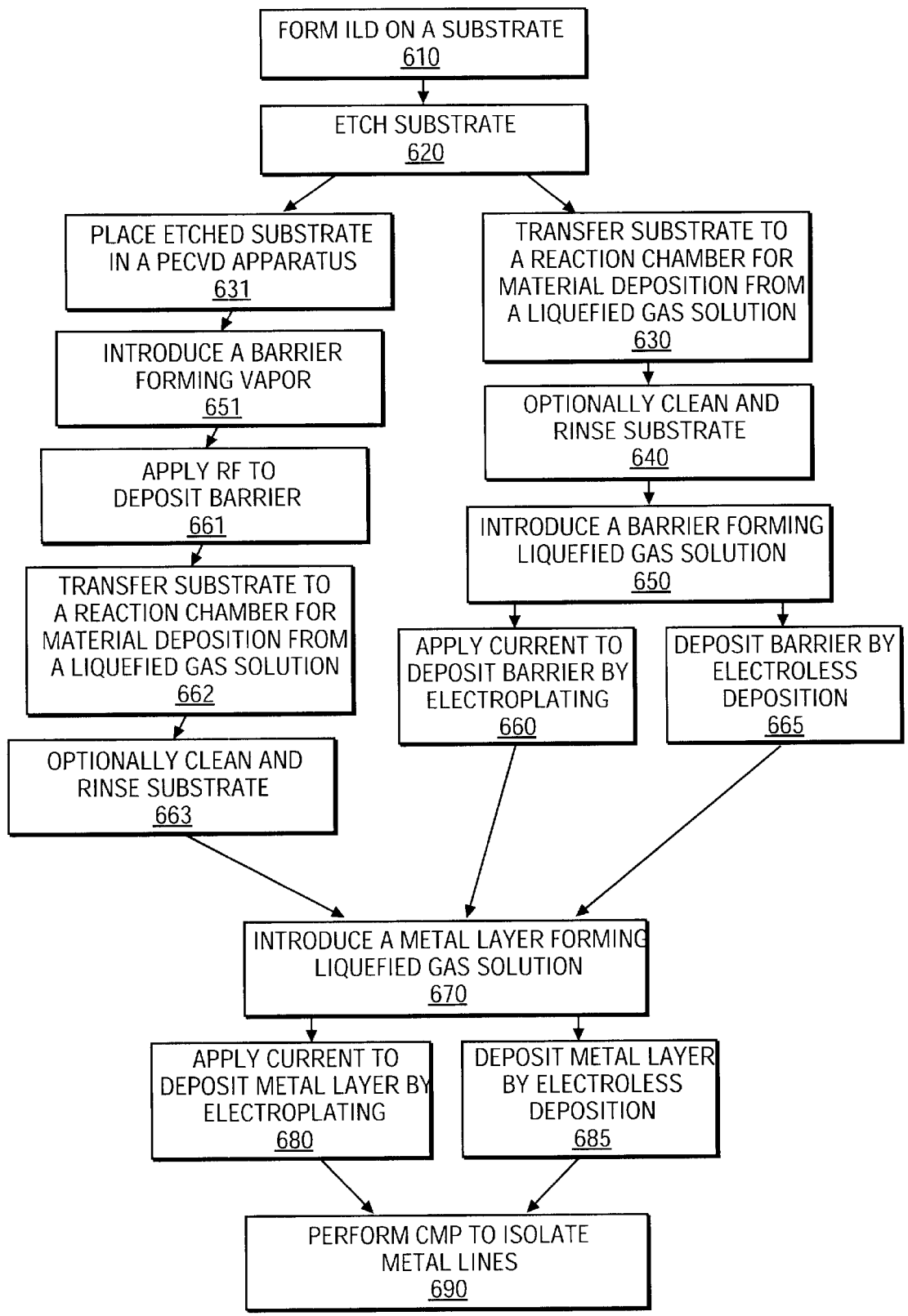
FIG. 6 is a flowchart summarizing an embodiment of semiconductor substrate processing.

In the embodiment shown, an inter-layer dielectric (ILD) 210 that has been formed on the substrate 100 shown (see also 610 of FIG. 6). The ILD 210 preferably has a dielectric constant (k) less than about 4 as a manner of maintaining lower capacitance between the trenches 255 to be filled with metal. Generally such ILD 210 materials are referred to as 'low k' materials. Low k materials used in ILD 210 embodiments here include, but are not limited to, fluorinated silica glass (FSG) and silicon based carbon doped oxides (CDO's).

The ILD 210 is deposited by placement of the substrate 100 in a reactor that, in one embodiment, is a plasma enhanced chemical vapor deposition (PECVD) apparatus. The PECVD apparatus is operated under conventional conditions and a gas mixture introduced into the apparatus where a plasma of the mixture is generated by radio frequency (RF). A low k material of the gas is deposited above the substrate 100. The gas mixture also includes a background gas, such as inert helium, as a volume filler and to encourage thermal uniformity during formation of the layer of low k material.

With reference to FIG. 2, trenches 255 are etched into the low k material layer such that it can be used as an ILD 210 as shown (see also 620 of FIG. 6). In the embodiment shown, the ILD 210 is patterned and etched by conventional means, preferably dry etching, to form the parallel trenches 255. Dry etching can be chosen to maintain an oxygen free environment for the substrate 100 to avoid oxidation. Etching is begun by placement of a protective mask pattern above the low k material layer exposing areas to form the trenches 255. Etching then proceeds through the exposed portions of the low k material with a chemical etchant. This forms the trenches 255 and leaves the low k material layer for use as an ILD 210.

Figure 5:
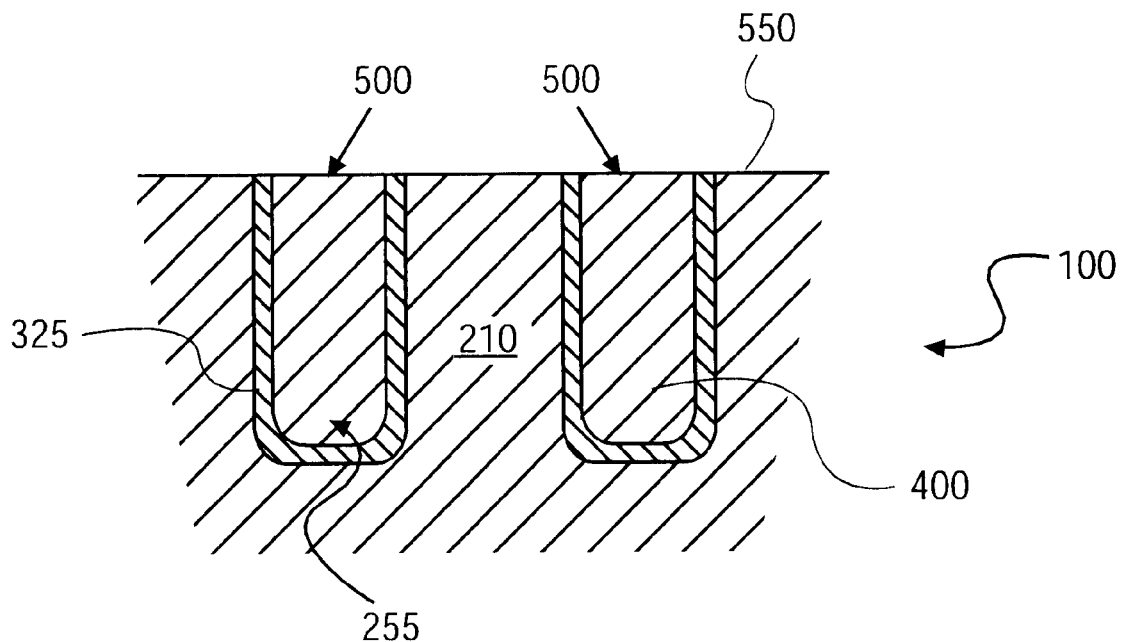
FIG. 5 is a side cross-sectional view of the semiconductor substrate of FIG. 4 following CMP polish, revealing isolated metal lines.

As discussed further herein, the trenches 255 are to accommodate metal lines 500 (see FIG. 5). However, the substrate 100, generally silicon based, and the ILD 210, as described above, are susceptible to diffusion of certain metal ions. For example, in one embodiment, the trenches 255 are to accommodate copper (Cu), having a high diffusivity into silicon-based materials such as the low k materials as described above and used in the ILD 210.

To maintain isolation of the metal to be formed in the trenches 255 and prevent diffusion of metal ions into the ILD 210, a barrier layer 325 (see FIG. 3) is formed in the trenches 255. In one embodiment, where copper (Cu) is to be deposited in the trenches 255, tantalum (Ta) barrier material is first deposited in the trenches 255. Copper (Cu) has a lower diffusivity into tantalum (Ta), which is therefore, used to prevent copper (Cu) diffusion into the underlying ILD 210 when the trenches 255 are accommodating copper (Cu).

In an embodiment where barrier material is to be deposited by electroplating, a seed layer of barrier material is placed at the surface of the substrate 100, for example, by PECVD deposition. The etched substrate 100 is then placed in the reaction chamber 101 for complete deposition of barrier materials (see also 630 of FIG. 6). In one embodiment, the surface of the substrate 100 is generally cleaned by introduction of a liquefied ammonia ($NH_3$) mixture containing general cleaning agents. Embodiments of the mixture include general cleaning agents of citric acid ($COOHOHC(CH_2COOH)_2$), hydrofluoric acid (HF), and hydrochloric acid (HCl).

Surface oxide imperfections can inhibit adhesion and performance of barrier materials deposited. Therefore, in another embodiment, where surface oxides are to be removed from the surface of the substrate, a surface oxide cleaning agent is introduced to the surface of the substrate 100 to dissolve any surface oxides present (see also 640 of FIG. 6). Embodiments of surface oxide cleaning agents include ammonium borofluorate ($NH_4BF_4$), hydrofluoric acid (HF), and hydrochloric acid (HCl) which may be combined in a mixture with liquefied ammonia ($NH_3$).

In another embodiment, a liquefied ammonia ($NH_3$) rinse is applied to the surface of the substrate 100 to remove any excesses of the mixtures described above or any free oxides. However, in another embodiment, some excess mixture of cleaning agents, as described above, is left to mix with a barrier forming liquefied gas solutions 175. This can improve the conductivity of the barrier forming liquefied gas solutions 175 for electroplating as described further below.

In another embodiment, a solution of a reducing agent, such as dimethyl amine borane (DMAB) (($CH_3)_2NHBH_3$), hydrazine ($N_2H_4$), or sodium borohydride ($NaBH_4$) is applied to the surface of the substrate 100 with a catalytic metal to encourage deposition only on the surface of the substrate 100 and not elsewhere in the reaction chamber 101 during electroplating as described below (see FIG. 1). Catalytic metals include, but are not limited to, palladium (Pd), gold (Au), silver (Ag), nickel (Ni), ruthenium (Ru), rhodium (Rh), and cobalt (Co).

Continuing with reference to FIG. 2, a barrier material is to be deposited on the surface of the substrate 100. The substrate 100 is exposed to a barrier forming liquefied gas solutions 175 that is introduced into the sealed environment of the reaction chamber 101 (see also 650 of FIG. 6). The barrier forming liquefied gas solutions 175 is a mixture of barrier material to be deposited and a gas solvent in a liquefied form. For example, in one embodiment, a salt, such as tantalum chloride, is mixed into, and dissolved by, a liquefied ammonia ($NH_3$) solvent to form the barrier forming liquefied gas solutions 175. In this manner, barrier material tantalum ions ($Ta^{5+}$) are disbursed throughout the barrier forming liquefied gas solutions 175. In one embodiment, the tantalum ions ($Ta^5+$) are in a concentration range from about 5.0 g/l to about 100 g/l.

In other embodiments, other salts are dissolved in the barrier forming liquefied gas solutions 175 in the manner described above. Embodiments of salts that can be dissolved in this manner for barrier formation include metal halogen salts of fluoride, bromide, astatide, iodide, and chloride, as noted above. In another embodiment, barrier forming ions are delivered and dissolved in the barrier forming liquefied gas solutions 175 by metal amines.

Embodiments of barrier forming liquefied gas solutions 175 can be formed from the dissolving of various metal salts into liquefied ammonia, as described above. This can take place in a vacuum within a remote mixing chamber prior to introduction to the reaction chamber and substrate 100. In this manner, no air is introduced to the barrier forming liquefied gas solutions 175 or subsequently to the substrate 100. Therefore, oxidation of the surface of the substrate 100 is avoided when the barrier forming liquefied gas solutions 175 is introduced.

Once the barrier forming liquefied gas solutions 175 is introduced, the barrier material, such as tantalum (Ta) described above, is then plated from the solution 175 to the surface of the substrate 100. In one embodiment, this is done by electroplating of the barrier material from the barrier forming liquefied gas solutions 175 (see also 660 of FIG. 6).

In a method of electroplating, a pressure of between about 0 psig and about 400 psig and a temperature from between about room temperature and about liquid Nitrogen ($N_2$) temperature is maintained in the reaction chamber 101. An anode 290 of the reaction chamber 101 is adjacent the substrate 100 and in contact with the barrier forming liquefied gas solutions 175 added to the reaction chamber. An electric current is introduced to the liquefied gas solutions 375 through the anode 290 from an external power source.

In the setup described above, the seed layer on the surface of the substrate 100 acts as a cathode and metal ions (i.e. the barrier material ions) are deposited above the surface of the substrate 100, including within the trenches 255. For example, in an embodiment where the barrier forming liquefied gas solutions 175 includes a dissolved tantalum chloride salt (e.g. having $Ta^{5+}$ and $Cl^-$ ions), the positively charged anode 290 will attract the non-metal chloride salt ions ($Cl^-$) as the metal ions of tantalum ($Ta^{5+}$) are deposited on the cathode substrate 100.

Figure 3:
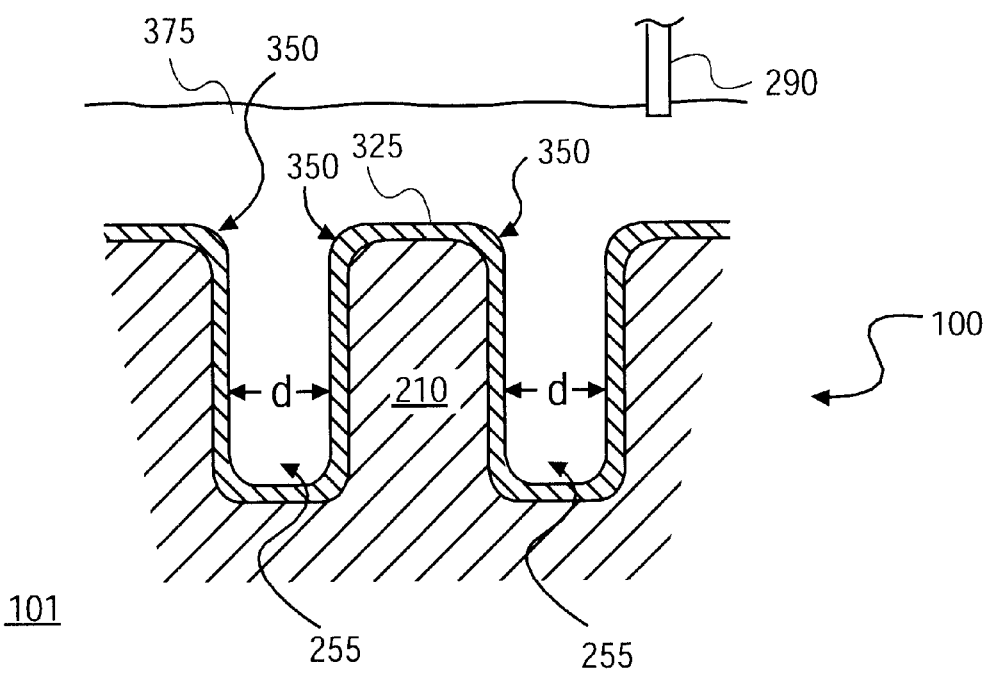
FIG. 3 is a side cross-sectional view of the semiconductor substrate of FIG. 2 to undergo a method of metal layer deposition.

Referring to FIG. 3, a barrier layer 325 has been formed by the method described above. The barrier layer 325 lines the trenches 255. Therefore, where, as described further below, the trenches 255 are to accommodate a metal, diffusion of metal ions into the ILD 210, or other underlying substrate 100 portions, is avoided. For example, in one embodiment, a tantalum (Ta) barrier layer 325 lines the trenches 255 to prevent diffusion of copper ions ($Cu^+$) into the ILD 210 upon deposition of copper (Cu) within the trenches.

As described above, a tantalum (Ta) barrier layer 325 is formed. However, in other embodiments, a barrier layer 325 can be formed as described above that is at least partially of manganese (Mn), magnesium (Mg), rhenium (Re), ruthenium (Ru), tungsten (W), osmium (Os), zirconium (Zr), niobium (Nb), titanium (Ti), hafnium (Hf), vanadium (V), iridium (Ir), cobalt (Co), or an alloy of one of these elements (or Tantalum (Ta)), including alloys combined with metalloids such as silicon (Si), boron (B), phosphorous (P), germanium (Ge), and gallium (Ga).

As described above, the barrier layer 325 is formed by an electroplating method utilizing a barrier forming liquefied gas solutions 175 (see FIG. 2). However, this is not required. In another embodiment, the barrier layer 325 can be formed by conventional means such as within a reactor that is a PECVD apparatus operated under conventional conditions (see also 631 of FIG. 6). In this embodiment a gas mixture that includes barrier material precursors is introduced into the apparatus as a vapor (see also 651 of FIG. 6). The barrier layer 325 is formed by applying RF to the vapor, generating a plasma that results in deposition of barrier material on the substrate 100 (see also 661 of FIG. 6). The deposition takes place within conventional PECVD parameters. The substrate 100 is subsequently moved to the reaction chamber described above (see also 662 of FIG. 6).

Where the barrier layer 325 is formed by a conventional method such as PECVD, the substrate 100 may be cleaned in the reaction chamber after formation of the barrier layer 325 in the PECVD apparatus (see also 663 of FIG. 6). The substrate 100 may be cleaned by introduction of a liquefied ammonia ($NH_3$) mixture with general cleaning agents as described above. Additionally, a surface oxide cleaning agent as described above can be introduced within the reaction chamber following formation of the barrier layer 325. In this embodiment, the cleaning agents are introduced following the formation of the barrier layer 325 because the substrate 100 oxidizes upon exposure to air when transferred between the PECVD apparatus and the reaction chamber where further processing is to take place. Therefore, cleaning and removal of any surface oxides above the barrier layer 325 may be of benefit. This is not required where the barrier layer 325 is formed within the reaction chamber or otherwise open transfer from a deposition apparatus avoided.

Referring to FIGS. 2 and 3, once the barrier layer 325 is formed and free of all surface oxides, a solution of reducing agent and a catalytic metal, as described above, can be applied above the barrier layer 325 to encourage deposition only above the barrier layer 325 (e.g. during metal layer formation described here). A metal layer forming liquefied gas solution 375 is then introduced within the reaction chamber (see also 670 of FIG. 6). As in the case of the barrier forming liquefied gas solutions 175, the metal layer forming liquefied gas solution 375 is a mixture of material to be deposited and a gas solvent in a liquefied form such as liquefied ammonia ($NH_3$). Of note, is the fact that no seed layer is required above the barrier layer 325 prior to introduction of the metal layer forming liquefied gas solution 375.

In one embodiment, a copper (Cu) salt, such as copper iodide (CuI) is mixed into a liquefied ammonia ($NH_3$) solvent to form the metal layer forming liquefied gas solution 375. In this embodiment, copper ions ($Cu^+$) will be in a concentration range from about 5 g/l to about 100 g/l. Embodiments of metal layer forming liquefied gas solutions 375 can be formed, in part, from metal halogen salts or metal amines as described above with reference to the barrier forming liquefied gas solutions 175.

Referring to FIG. 3, embodiments of metal layer forming liquefied gas solutions 375 can be formed from the dissolving of various metal salts into liquefied ammonia ($NH_3$) as described above. This can take place in a vacuum within a remote mixing chamber prior to introduction to the reaction chamber. In this manner, no air is introduced to the metal layer forming liquefied gas solution 375 or subsequently to the barrier layer 325.

Figure 4:
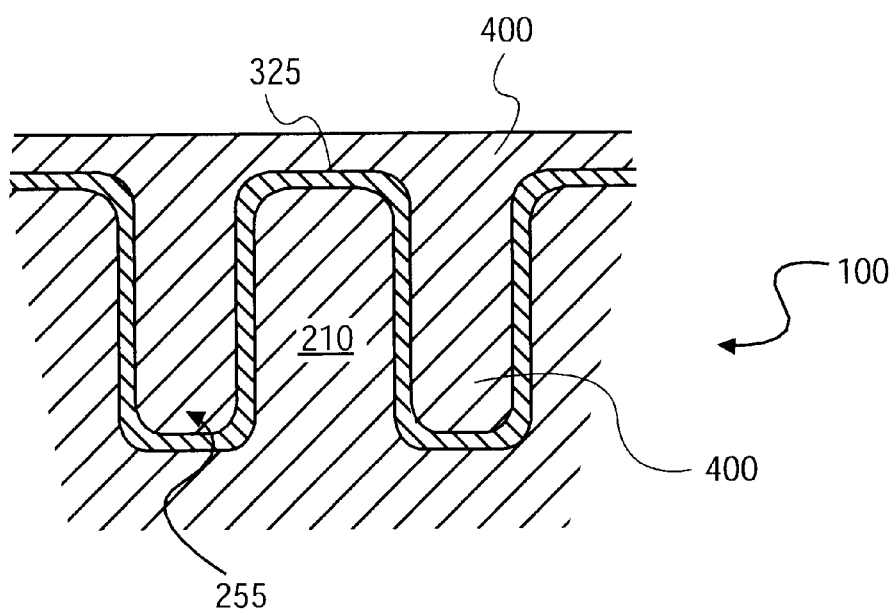
FIG. 4 is a side cross-sectional view of the semiconductor substrate of FIG. 3 following methods of barrier and metal layer deposition.

Similar to electroplating of the barrier layer 325, metal layer material is electroplated from the metal layer forming liquefied gas solution 375 to form a metal layer 400 as shown in FIG. 4 (see also 680 of FIG. 6). During this electroplating, a pressure of between about 0 psig and about 400 psig and a temperature from between about room temperature and about liquid Nitrogen ($N_2$) temperature is again maintained in the reaction chamber. The anode 290 adjacent the substrate 100 introduces an electric current to the metal layer forming liquefied gas solution 375.

The surface of the substrate 100 again acts as a cathode and material ions (i.e. this time the metal layer material ions) are deposited within the trenches 255 above the barrier layer 325. For example, in an embodiment where the metal layer forming liquefied gas solution 375 includes dissolved copper iodide salt (e.g. having $Cu^+$ and $I^-$ ions), the positively charged anode 290 will attract the non-metal iodide ions ($I^-$) as the metal ions of copper ($Cu^+$) are deposited on the cathode substrate 100 above the barrier layer 325.

Referring to FIGS. 3 and 4, a metal layer 400 is formed. Electroplating, as described above, avoids the less efficient use of a seed layer in forming a metal layer 400. There is no build-up or overhang of a seed layer at step portions 350 of the trenches 255. This helps prevent the formation of trapped voids which could otherwise interfere with the performance and integrity of the metal layer 400. In fact, even as trenches 255 become narrower and narrower (e.g. with respect to the distance (d) between trench sidewalls), there is still no concern over overhang where the metal layer forming liquefied gas solution 375 is used to deposit the metal layer 400. In an embodiment where the metal layer forming liquefied gas solution 375 includes ammonia ($NH_3$), the zero surface tension of the ammonia ($NH_3$) further enhances deposition within the narrow trenches 255.

In addition to the above advantages, the entire deposition process described above can take place in an oxygen free environment such that oxidation is not of concern. Therefore, adhesion between the metal layer 400 and the barrier 125 is improved compared to adhesion obtained from conventional deposition methods.

In another embodiment, trapped voids are further avoided by ensuring bottom-up deposition of the metal from the liquefied gas solutions 375 into the trenches 255. Additives can be incorporated into the metal layer forming liquefied gas solution 375 to ensure that deposition proceeds from the bottom of a trench 155 up. The additives can be additives known to encourage bottom-up fill in other conventional deposition methods. Such additives include sulfides, such as bis-(sodium-sulfopropyl)-disulfide or propane sulfonic acid, and polyethers such as polyamides or polyethyleneglycol. Accelerators, such as the above referenced sulfides, are more heavily drawn to lower portions of the trenches 255 as compared to suppressors (e.g. polyethers) that are seen in greater concentration at the upper portion of the trenches 255. Therefore, deposition occurs at a greater rate at lower portions of the trenches 255. This ensures bottom-up fill of the trenches 255.

As described above, a metal layer 400 of copper (Cu) is formed above a tantalum (Ta) barrier layer 325. However, the metal layer 400, like the barrier layer 325, can be tailored to a variety of forms. For example, in other embodiments other types of metal layers 300 are deposited that include copper alloys and copper alloys with metalloids such as silicon (Si), boron (B), phosphorous (P), germanium (Ge), and gallium (Ga). Additionally, in other embodiments of the invention, the resulting metal layer 400 can be tailored by addition of a variety of materials such as doping ions, superconducting materials or semiconductor materials to the metal layer forming liquefied gas solution 375 prior to electroplating.

Continuing with reference to FIGS. 3 and 4, once the metal layer 400 is formed, the substrate 100 is prepared for removal from the reaction chamber. In one embodiment, the reaction chamber is drained of metal layer forming liquefied gas solution 375. The substrate 100, including the newly formed metal layer 400, is then rinsed with liquefied ammonia ($NH_3$) and dried with an inert gas such as helium (He).

Referring to FIG. 5, the substrate 100 undergoes conventional chemical mechanical polishing (CMP) (see also 690 of FIG. 6). This leaves a smoothed substrate surface 550 removing any excess metal there above. What remains of the metal layer 400 is isolated within the trenches 255 by a barrier layer 325 in the form of metal lines 500.

Referring to FIG. 6, the above methods of liquid deposition are summarized by way of a flowchart indicating one preferred embodiment of semiconductor substrate processing of a substrate to accommodate isolated metal lines. However, other embodiments are possible which do not incorporate such features. In the embodiment shown, an ILD is first formed on a substrate 610. The substrate is then etched 620 to form trenches, between which the ILD material will act as an insulating ILD. In an alternate embodiment no ILD material is deposited and etching can also be avoided. The substrate is then transferred to a reaction chamber for material deposition from a liquefied gas solution 630. In a alternate embodiment discussed below, the substrate is placed in a PECVD apparatus 631, in lieu of the reaction chamber, for liquid deposition.

Once in the reaction chamber, the substrate can be optionally cleaned and rinsed 640 to remove any surface oxides or other debris. A barrier forming liquefied gas solution is then introduced 650. Depending upon the composition of the solution, a current can be applied to deposit a barrier on the substrate surface by electroplating 660 or alternatively by electroless deposition 665.

In an alternate embodiment, the barrier is formed on the substrate surface by PECVD deposition in a PECVD apparatus 631. A barrier forming vapor is introduced 651 into the apparatus and RF applied to deposit the barrier 661 on the substrate surface. Once the barrier is formed, the substrate is then transferred to a reaction chamber for material deposition from a liquefied gas solution 662 where it may be optionally cleaned and rinsed 663 as described above.

Once the barrier is formed and the substrate within the reaction chamber for liquid deposition, a metal layer forming liquefied gas solution is introduced 670. Again, depending on the composition of the solution, a current can be applied to electroplate a metal layer 680 on the substrate surface, or alternatively deposit the metal layer by electroless deposition 685. Once a substrate is formed with a metal layer thereon, isolation of metal lines can be achieved by conventional CMP methods 690.

The above methods of deposition indicate liquid deposition for formation of a barrier or metal layer by way of electroplating. However, in alternate embodiments, liquid deposition of a barrier or metal layer is achieved by use of a liquefied gas solution in an otherwise conventional electroless deposition method. For example, a liquefied gas solution can be introduced into a reaction chamber as described above. The liquefied gas solution can again contain ions of material to be deposited that are dissolved in liquefied ammonia ($NH_3$). However, the solution will also contain a conventional reducing agent, such as hydrogen ($H_2$) along with a redox pair to effect otherwise conventional electroless deposition of the deposit material ions (see also 665, 685 of FIG. 6). Redox pairs can be of titanium ($Ti^{3+}/Ti^{4+}$), tin ($Sn^{2+}/Sn^{4+}$), chromium ($Cr^{2+}/Cr^{3+}$), iron ($Fe^{2+}/Fe^{3+}$), or vanadium ($V^{2+}/V^{3+}$). Additionally, selective deposition may be achieved by heating of only the substrate during deposition. The electroless deposition may proceed at a temperature between about room temperature and about 300° C.

Embodiments described above include methods of liquid deposition. Additionally, embodiments include methods of depositing material for semiconductor features. Although exemplary embodiments describe particular barrier and metal layer depositions, additional embodiments are possible. For example, a variety of interconnect structure material, including for superconductors, can be deposited according to methods described above. Additionally, many changes, modifications, and substitutions may be made without departing from the spirit and scope of these embodiments.

I claim:

1. A method comprising:
   providing a substrate having a trench etched thereinto;
   liquifying a gas solvent and ions of a material to form a liquefied gas solution; and
   introducing said liquefied gas solution to said trench to deposit said material within said trench.

2. The method of claim 1 wherein said introducing of said liquefied gas solution to said trench occurs in vacuum.

3. The method of claim 1 wherein said ions of said material are between about 5.0 g/l and about 100 g/l of said liquefied gas solution.

4. The method of claim 1 wherein said material is to form a barrier layer in said trench, said method further comprising adding a reducing agent and a catalytic metal to a surface of said trench prior to said introducing to deposit said material within said trench only at said surface of said trench.

5. The method of claim 1 further comprising placing said substrate in a reaction chamber prior to said introducing, said liquefied gas solution further including a reducing agent and a redox pair to cause electroless deposition of said material within said trench upon said introducing.

6. The method of claim 1 further comprising:
placing said substrate in a reaction chamber having an anode therein coupled to a power source prior to said introducing; and
electroplating to deposit said material within said trench after said introducing by running a current through said anode from said power source to said liquefied gas solution in contact with said anode.

7. The method of claim 6 further comprising:
cleaning said substrate with a surface oxide cleaning agent to remove any surface oxides from said trench; and
rinsing said substrate to remove a portion of said surface oxide cleaning agent prior to said introducing.

8. The method of claim 7 wherein said portion is a first portion, said rinsing leaving a second portion of said surface oxide cleaning agent to mix with said liquefied gas solution during said introducing to improve conductivity for said electroplating.

9. The method of claim 1 wherein said liquefied gas solution includes liquefied ammonia as a solvent for said material.

10. The method of claim 9 wherein said ions of said material are provided by one of a salt and an amine of said material dissolved in said liquefied ammonia.

11. The method of claim 10 wherein said salt is a halogen salt.

12. The method of claim 1 further comprising adding additives to said trench to ensure bottom-up fill of said trench as said material is deposited.

13. The method of claim 12 wherein said additives include sulfide accelerators to accumulate at a lower portion of said trench.

14. The method of claim 13 wherein said additives include polyether suppressors in greater concentration at a higher portion of said trench.

15. A method comprising:
providing a substrate having a barrier layer at a surface thereof;
liquifying a gas solvent and ions of a metal to form a liquefied gas solution; and
introducing the liquefied gas solution to said barrier layer to deposit a metal layer of said metal on said barrier layer.

16. The method of claim 15 wherein said introducing of said liquefied gas solution to said barrier layer occurs in vacuum.

17. The method of claim 15 wherein said liquefied gas solution includes liquefied ammonia gas, said ions of said metal being copper ions provided by a copper salt dissolved in said liquefied ammonia gas.

18. The method of claim 17 wherein said barrier layer is at least partially of a barrier material selected from a group consisting of tantalum, manganese, magnesium, rhenium, ruthenium, tungsten, osmium, zirconium, niobium, titanium, hafnium, vanadium, iridium, and cobalt.

19. A method comprising:
providing a substrate having a trench etched thereinto;
depositing a barrier layer at a surface of said substrate by vapor deposition;
liquifying a gas solvent and ions of a metal to form a liquefied gas solution; and
introducing a liquefied gas solution including ions of a metal to said barrier layer to deposit a metal layer of said metal on said barrier layer.

20. The method of claim 19 wherein said vapor deposition is plasma enhanced chemical vapor depositon.

21. A method comprising:
providing a substrate having a trench etched the reinto;
introducing a liquefied gas solution including ions of a material to a surface of said substrate to deposit a barrier layer of said material on said surface of said substrate; and
exposing said barrier layer to a liquefied gas solution including ions of a metal to deposit a metal layer of said metal on said barrier layer.

22. The method of claim 21 wherein said barrier layer and said metal layer are deposited by electroplating.

* * * * *